United States Patent
Chen (10) Patent No.: US 8,302,300 B2
(45) Date of Patent: Nov. 6, 2012

(54) METHOD FOR MANUFACTURING MULTILAYER PRINTED CIRCUIT BOARD WITH PLATED THROUGH HOLES

(75) Inventor: Ye-Ning Chen, Shenzhen (CN)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 71 days.

(21) Appl. No.: 13/095,877

(22) Filed: Apr. 28, 2011

(65) Prior Publication Data

US 2011/0308082 A1 Dec. 22, 2011

(30) Foreign Application Priority Data

Jun. 18, 2010 (CN) .......................... 2010 1 0203168

(51) Int. Cl.
*H01K 3/10* (2006.01)
(52) U.S. Cl. .................. 29/852; 29/830; 29/833; 29/834
(58) Field of Classification Search .................... 29/830, 29/833, 834, 852
See application file for complete search history.

(56) References Cited

U.S. PATENT DOCUMENTS

| | | | | |
|---|---|---|---|---|
| 5,048,178 A * | 9/1991 | Bindra et al. | .................. | 29/830 |
| 6,000,124 A * | 12/1999 | Saito et al. | ........................ | 29/830 |
| 6,609,297 B1 * | 8/2003 | Hiramatsu et al. | .............. | 29/852 |
| 7,127,812 B2 * | 10/2006 | Hiramatsu et al. | .............. | 29/852 |
| 7,614,787 B2 * | 11/2009 | Nakagawa | .................... | 378/205 |

* cited by examiner

*Primary Examiner* — Carl Arbes
(74) *Attorney, Agent, or Firm* — Altis Law Group, Inc.

(57) ABSTRACT

A method for manufacturing multilayer printed circuit board includes steps below. A first copper clad laminate includes a central portion and a peripheral portion is provided. A group of concentric copper annular collars is formed by etching the peripheral portion. A second copper clad laminate and an adhesive layer is laminated on to the first copper clad laminate in a manner that the adhesive is sandwiched between the first copper clad laminate and the second copper clad laminate to form a multilayer substrate. A detection hole is formed run through the multilayer substrate. An offset distance is determined and plated through holes in the central portion of the multilayer substrate is formed based on the offset distance.

20 Claims, 11 Drawing Sheets

METHOD FOR MANUFACTURING MULTILAYER PRINTED CIRCUIT BOARD WITH PLATED THROUGH HOLES

BACKGROUND

1. Technical Field

The present disclosure generally relates to printed circuit boards (PCBs) and particularly, relates to a method for manufacturing a multilayer printed circuit board with plated through holes.

2. Description of Related Art

PCBs are widely used in most electronic devices for mounting electronic components and providing electrical connections. Improvements in electronic technology, means there is a special need for a high interconnection density and integrated multilayer printed circuit boards. Therefore, forming high precision interconnection plated through holes is a key process in manufacturing a multilayer PCB.

The plated through holes of the multilayer PCBs are generally formed by three steps. The first one is laminating at least two copper clad laminates into a multilayer substrate. The second one is forming a through hole by mechanical drilling process or by a laser ablation technology in the multilayer substrate with reference to an alignment mark such as a hole. The third step is forming a copper layer in the inner wall of the through hole by plating process creating a plated through hole. However, the at least two copper clad laminates will thermal expand after the laminating process, causing the alignment mark to shift from its initial location. As such, the plated through holes will have a bias error reference to its designed location. That leads a poor even failed interconnection in the multilayer substrate.

What is needed, therefore, is a method for manufacturing a multilayer printed circuit board to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below and with reference to the drawings.

Referring to FIGS. 1-11, a method for manufacturing a multilayer printed circuit board with plated through holes includes the following steps.

Figure 1:
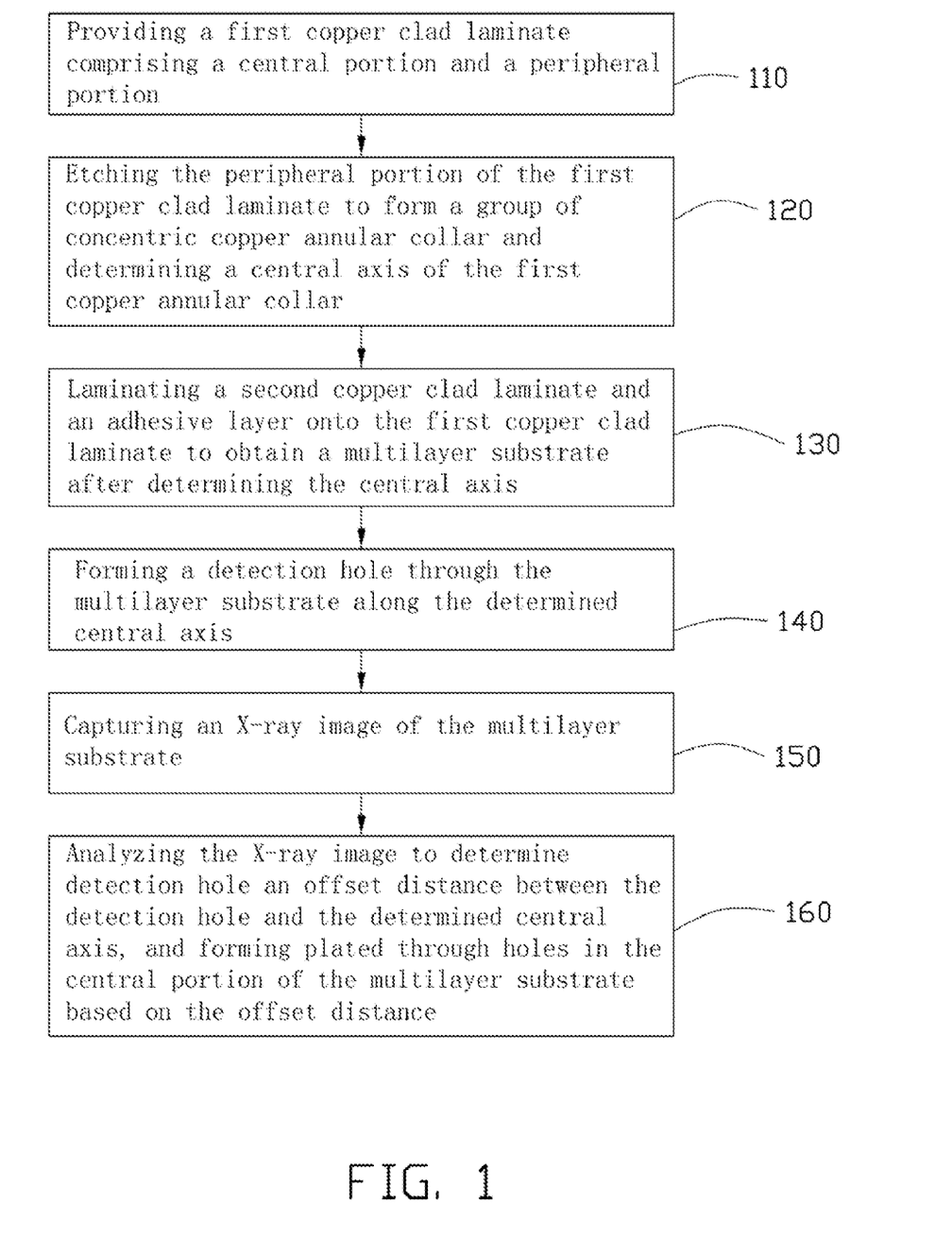
FIG. 1 is a flow chart showing a method for manufacturing a multilayer printed circuit board with plated through holes in accordance with an exemplary embodiment.
Figure 2:
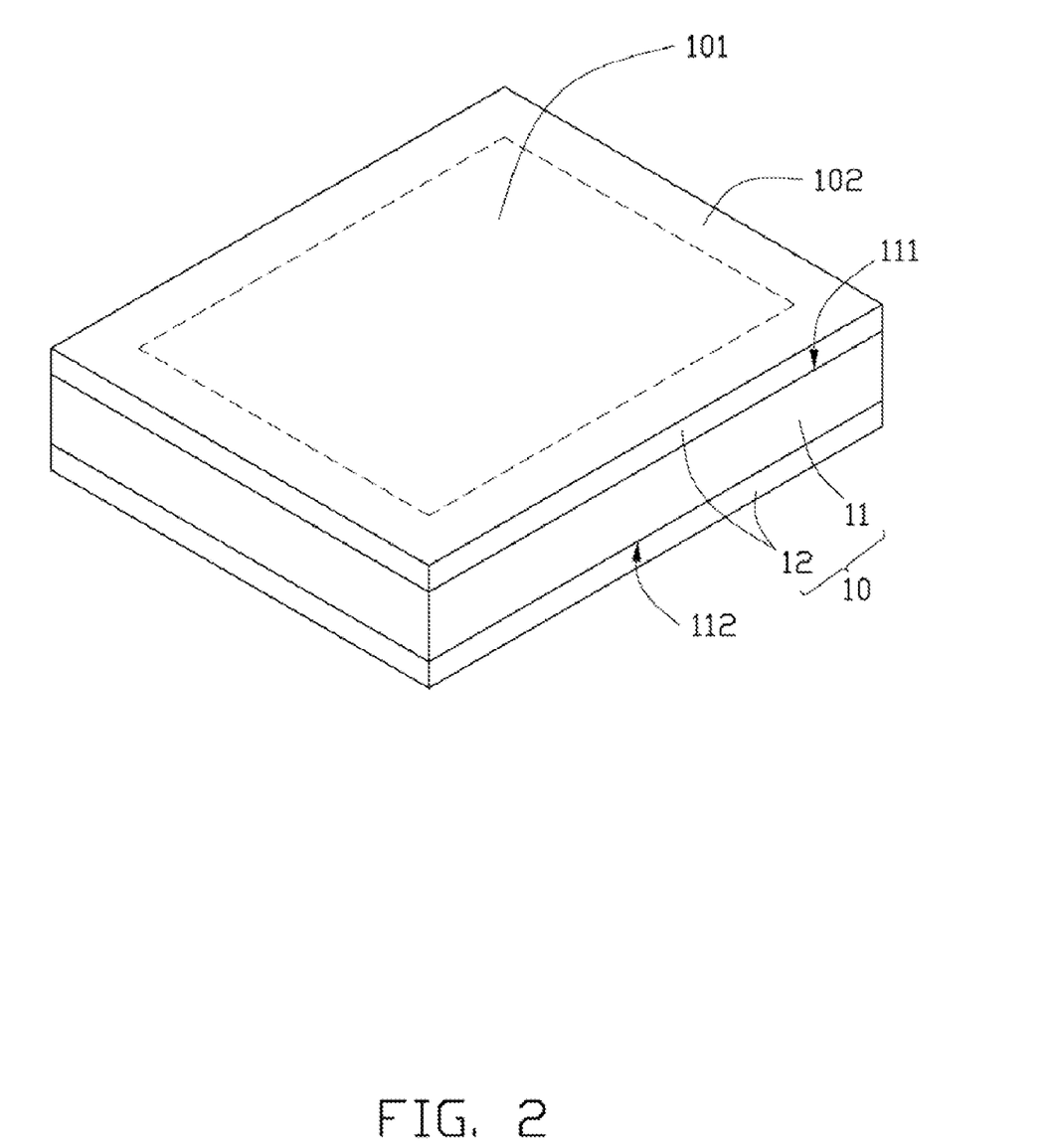
FIG. 2 is a perspective view of a first copper clad laminate in accordance with an exemplary embodiment.

In step 1, referring to FIG. 2, a first copper clad laminate 10 is provided.

The first copper clad laminate 10 includes a first insulating layer 11 and at least one first copper foil layer 12. The first insulating layer 11 has a first surface 111 and an opposite second surface 112. In the illustrated embodiment, both of the first surface 111 and the second surface 112 have a first copper foil layer 12 attached on the first insulating layer 11. That is to say, the first copper clad laminate 10 is a double-sided substrate. In another embodiment, the first clad laminate 10 can be a single-sided substrate. The first copper clad laminate 10 includes a central portion 101 and a peripheral portion 102 surrounding the central portion 101. The central portion 101 is configured to form a printed circuit board. The peripheral portion 102 is to be cut off.

Figure 3:
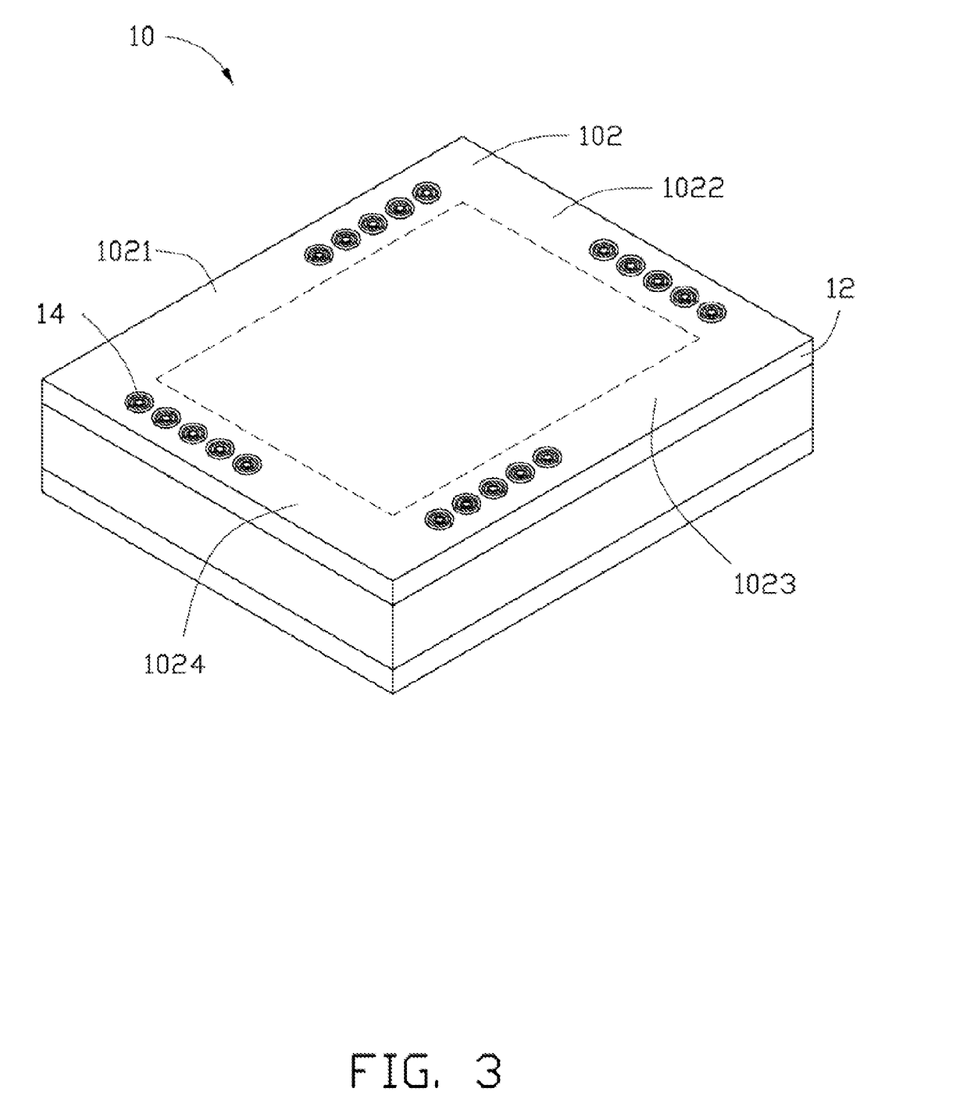
FIG. 3 is similar to FIG. 2, but showing a number of groups of concentric copper annular collars formed in a peripheral portion of the first copper clad laminate in accordance with an exemplary embodiment.
Figure 4:
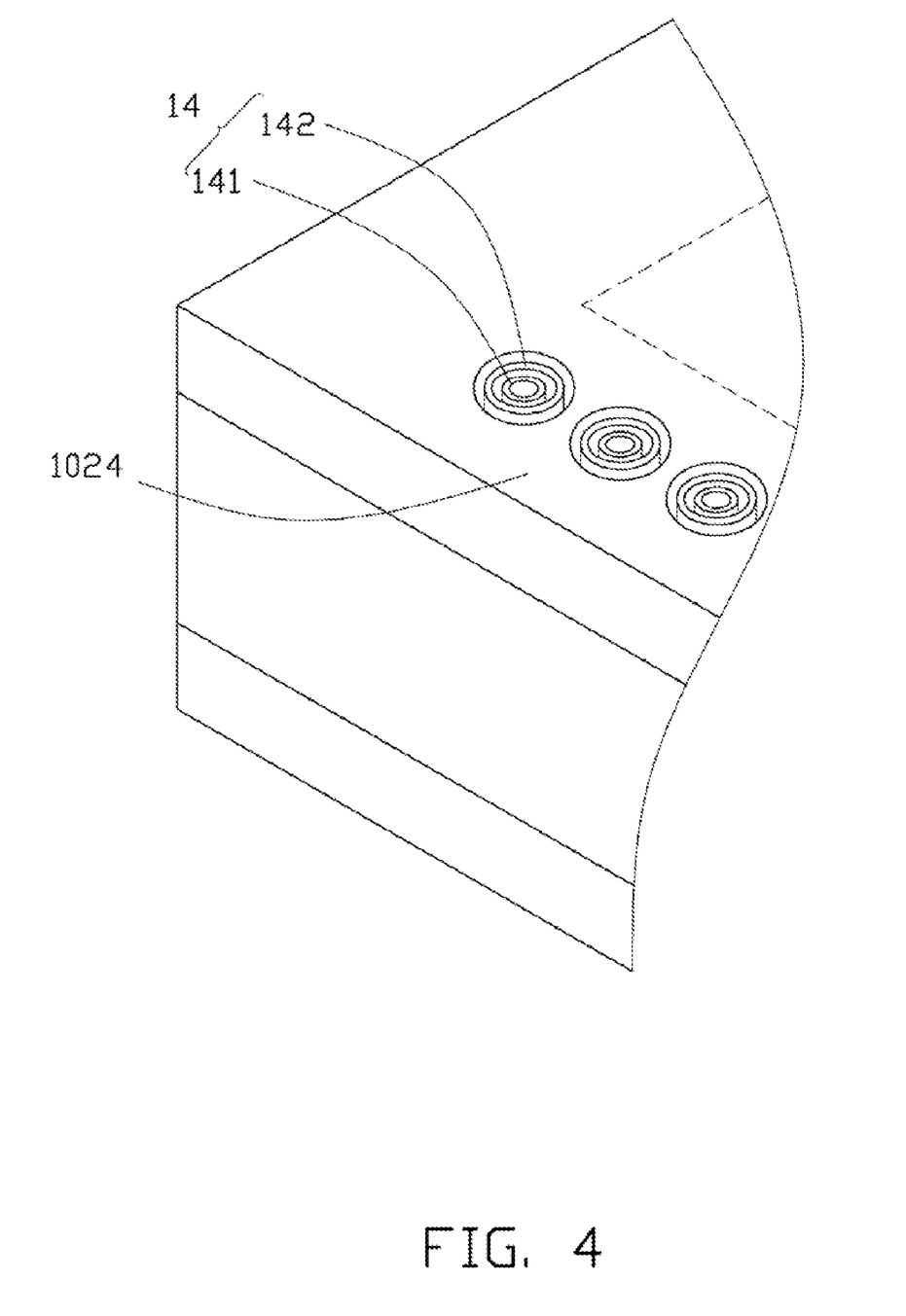
FIG. 4 is a partial enlarged drawing of FIG. 3.

In step 2, referring to FIGS. 3 and 4, at least one group of concentric copper annular collars 14 is formed by etching the peripheral portion 102 of the at least one first copper foil layer 12.

The first copper clad laminate 10 is rectangular, and the peripheral portion 102 includes a first edge portion 1021, a second edge portion 1022, a third edge portion 1023 opposites to the first edge portion 1021, and a fourth edge portion 1024 opposites to the second edge portion 1022. In this embodiment, each of the two first copper layers 12 of the peripheral portion 102 is etched to form a number of groups of concentric copper annular collars 14.

In an exemplary embodiment, as shown in FIG. 3, each of the first copper foil layers 12 has twenty groups of concentric copper annular collars 14. The first edge portion 1021, the second edge portion 1022, the third edge portion 1023 and the fourth edge portion 1024 each have five groups of concentric copper annular collars 14. The five groups of concentric copper annular collars 14 on the first edge portion 1021 are equidistantly arranged along a straight line parallel and lengthwise and are adjacent to the second edge portion 1022. The five groups of the concentric copper annular collars 14 on the second edge portion 1022 are equidistantly arranged along a straight line parallel and widthwise and are adjacent to the third edge portion 1023. The five groups of the concentric copper annular collars 14 on the third edge portion 1023 are equidistantly arranged along a straight line parallel and lengthwise and are adjacent to the fourth edge portion 1024. The five groups of concentric copper annular collars 14 on the fourth group 1024 are equidistantly arranged along a straight line parallel and widthwise and are adjacent to the first edge portion 1021.

Each of the group of concentric copper annular collars 14 comprises a first copper annular collar 141 and a second copper annular collar 142. The second copper annular collar 142 surrounds the first annular collar 141 and is concentric with the first annular collar 141. An initial reference axis is defined coaxial with a central axis of the first copper annular collar 141. A CCD camera may be used to determine a central axis of the first copper annular as the initial reference axis and to record the corresponding coordinates of the initial reference axis in this process.

An outer diameter of the first copper annular collar 141 is smaller than an inner diameter of the second copper annular collar 142. An inner diameter of the first copper annular collar 141 is larger than a diameter of a smallest one of the plated through holes to be formed in the multilayer printed circuit board. In one embodiment, the diameter of the smallest one of the plated through holes to be formed in the multilayer printed circuit board plus a gap distance between the first copper annular collar 141 and the second copper annular collar 142 is equal to the inner diameter of the first copper annular collar 141. The inner diameter of the first copper annular collar 141 can be selectively changed according to the diameter of the smallest one of the through holes that would be formed in the multilayer printed circuit board. For example, if the diameter of the smallest one of the through holes to be formed in the multilayer printed circuit is denoted as d mil, the gap distance between the first copper annular collar 141 and the second copper annular collar 142 is 2 mil, thus, the inner diameter of the first copper annular collar 141 is equal to (d+2) mil.

A sidewall of the first copper annular collar 141 has a same thickness as a sidewall of the second copper annular collar 142, and is equal to the gap distance between the first copper annular collar 141 and the second copper annular collar 142. The thickness of the sidewall of the first copper annular collar 141 is a distance between an inner wall of the first copper annular collar 141 and an outer wall of the first copper annular collar 141. The thickness of the sidewall of the second copper annular collar 142 is a distance between an inner wall of the second copper annular collar 142 and an outer wall of the second copper annular collar 142. For example, the thickness of the sidewall of the first copper annular collar 141, the thickness of the sidewall of the second copper annular collar 142, and the gap distance between the first copper annular collar 141 and the second copper annular collar 142 can be 2 mil. The thickness of the sidewall of the first copper annular collar 141, the thickness of the sidewall of the second copper annular collar 142, and the gap distance between the first copper annular collar 141 and the second copper annular collar 142 are not limited and can be 1 mil or less than 1 mil. Additionally, each group of concentric copper annular collars 14 can further comprise a third copper annular collar and a fourth copper annular collar. An inner diameter of the third copper annular collar is larger than an outer diameter of the second copper annular collar 142. An inner diameter of the fourth copper annular collar is larger than an outer diameter of the third copper annular collar. The thickness of the sidewall of the first copper annular collar 141, the thickness of the sidewall of the second copper annular collar 142, the thickness of the sidewall of the third copper annular collar, and the thickness of the sidewall of the fourth copper annular collar are equal to a gap distance between any two adjacent copper annular collars.

A number of groups of concentric copper annular collars 14 in the peripheral portion 102 may be defined in other forms. A better description can be given in the following paragraphs combined with FIGS. 5-8.

Figure 5:
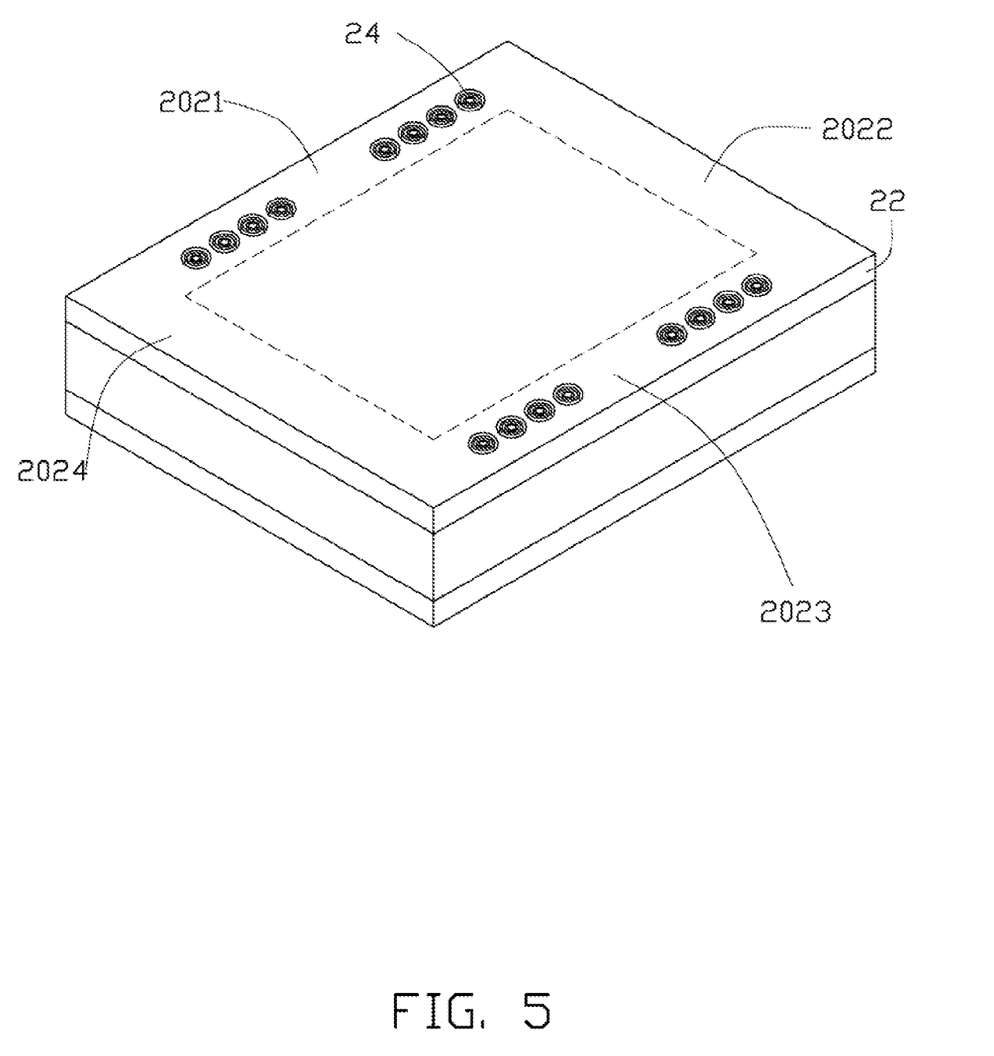
FIG. 5 is similar to FIG. 2, but showing another embodiment of a number of groups of concentric copper annular collars formed in a peripheral portion of the first copper clad laminate.

As shown in FIG. 5, in another embodiment, each of the first copper foil layers has sixteen groups of concentric copper annular collars 24. The first edge portion 2021 and the third edge portion 2023 each have eight groups of concentric copper annular collars 24. Four groups of concentric copper annular collars 24 on the first edge portion 2021 are equidistantly arranged along a straight line and are adjacent to the second edge portion 2022. The other four groups of concentric copper annular collars 24 on the first edge portion 2021 are equidistantly arranged alone a straight line and are adjacent to the fourth edge portion 2024. Four groups of the concentric copper annular collars 24 on the third edge portion 2023 are equidistantly arranged alone a straight line and are adjacent to the second edge portion 2022, the other four groups of the concentric copper annular collars 24 on the third edge portion 2023 are equidistantly arranged alone a straight line and are adjacent to the fourth edge portion 2024. Therefore, each of the four groups of concentric copper annular collars 24 has four determined central axes on one surface. In this embodiment, the eight groups of concentric copper annular collars 24 on the first edge portion 2021 have eight determined central axes on one surface, the eight groups of concentric copper annular collars 24 on the third edge portion 2023 have eight determined central axes on one surface.

Figure 6:
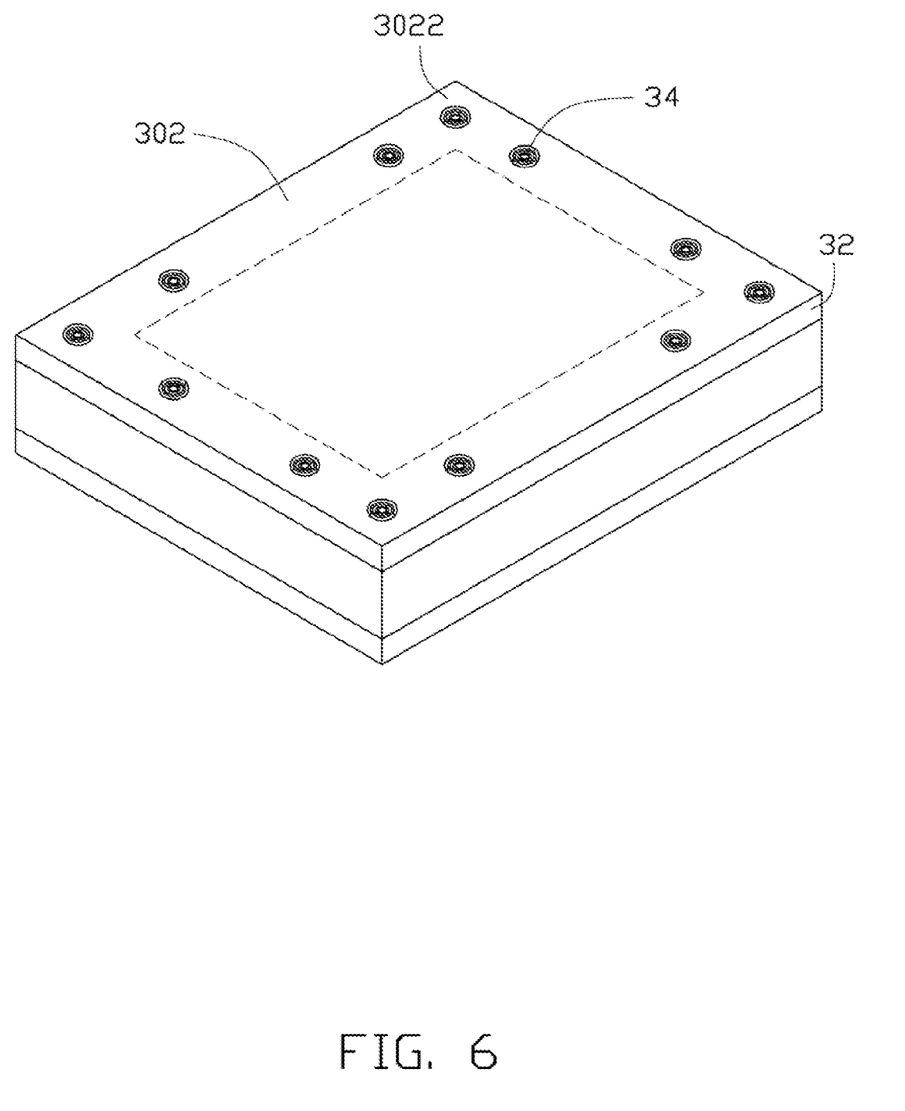
FIG. 6 is similar to FIG. 2, but showing a third embodiment of a number of groups of concentric copper annular collars formed in a peripheral portion of the first copper clad laminate.

As shown in FIG. 6, in a third embodiment, each of the first copper foil layer 32 has twelve groups of concentric copper annular collars 34 on a peripheral portion 302. The first copper foil layer 32 is rectangular. The first copper foil layer 32 has four corners 3022 on the peripheral portion 302. Each corner 3022 consists of three groups of concentric copper annular collars 34 arranged on three top-points of a triangle. In this embodiment, the three determined central axes of each of the three groups of concentric copper annular collars 34 on a corner 3022 are arranged on three top-points of a right angle triangle.

Figure 7:
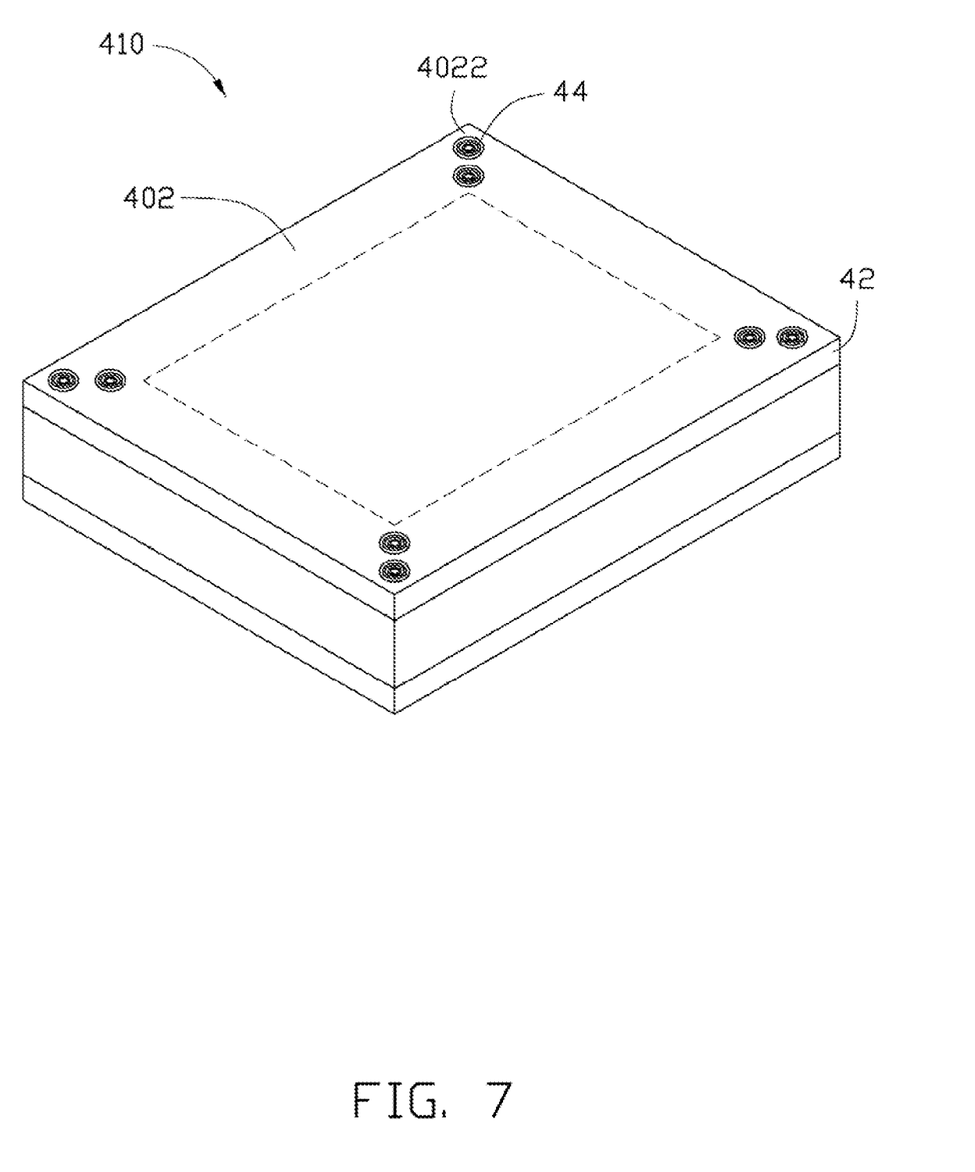
FIG. 7 is similar to FIG. 2, but showing a fourth embodiment of a number of groups of concentric copper annular collars formed in a peripheral portion of the first copper clad laminate.

As shown in FIG. 7, in a fourth embodiment, each of the first copper foil layers 42 has eight groups of concentric copper annular collars 44 on a peripheral portion 402. The first copper foil layer 42 is rectangular. The first copper foil layer 42 has four corners 4022 on the peripheral portion 402. Each corner 4022 consists of two groups of concentric copper annular collars 44 arranged alone a straight line parallel to a diagonal of a surface of the first copper foil layer 42. In this embodiment, four determined central axes of four groups of the concentric copper annular collars 44 are on one surface along one diagonal of the surface of the first copper foil layer 42. The other four determined central axes of other four groups of concentric copper annular collars 44 are on one surface alone another diagonal of the surface of the first copper foil layer 42.

Figure 8:
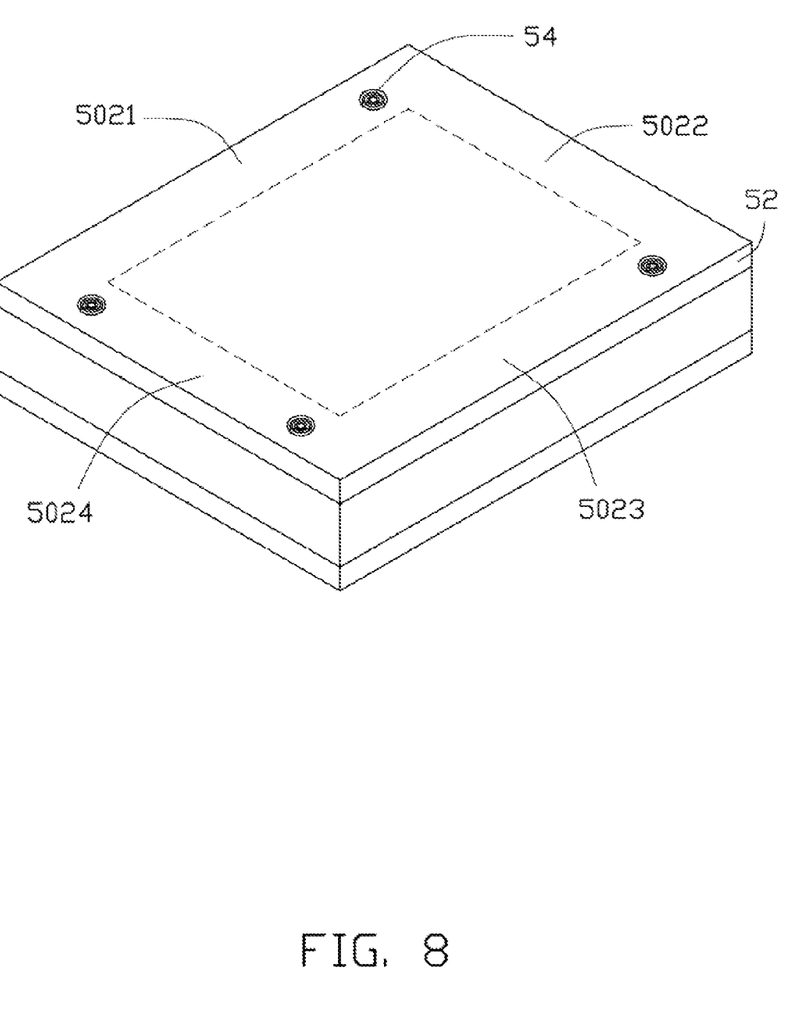
FIG. 8 is similar to FIG. 2, but showing a fifth embodiment of a number of groups of concentric copper annular collars formed in a peripheral portion of the first copper clad laminate.

As shown in FIG. 8, in a fifth embodiment, each of the first copper foil layer 52 has four groups of concentric copper annular collars 54 on a peripheral portion 502.

The first edge portion 5021 has one group of concentric copper annular collars 24 adjacent to the second edge portion 5022. The third edge portion 5023 has one group of concentric copper annular collars 24 adjacent to the second edge portion 5022. The fourth edge portion 5024 has two groups of concentric copper annular collars 24 adjacent to the first edge portion 5021 and the third edge portion 5023 respectively. In this embodiment, the two groups of concentric copper annular collars 54 on the fourth edge portion 2021 have two determined central axes on a surface paralleled to a surface formed by the two determined central axes of the one groups of concentric copper annular collars 54 on the first edge portion 5021. In addition, the one group of concentric copper annular collars 54 on the third edge portion 5023.

Figure 9:
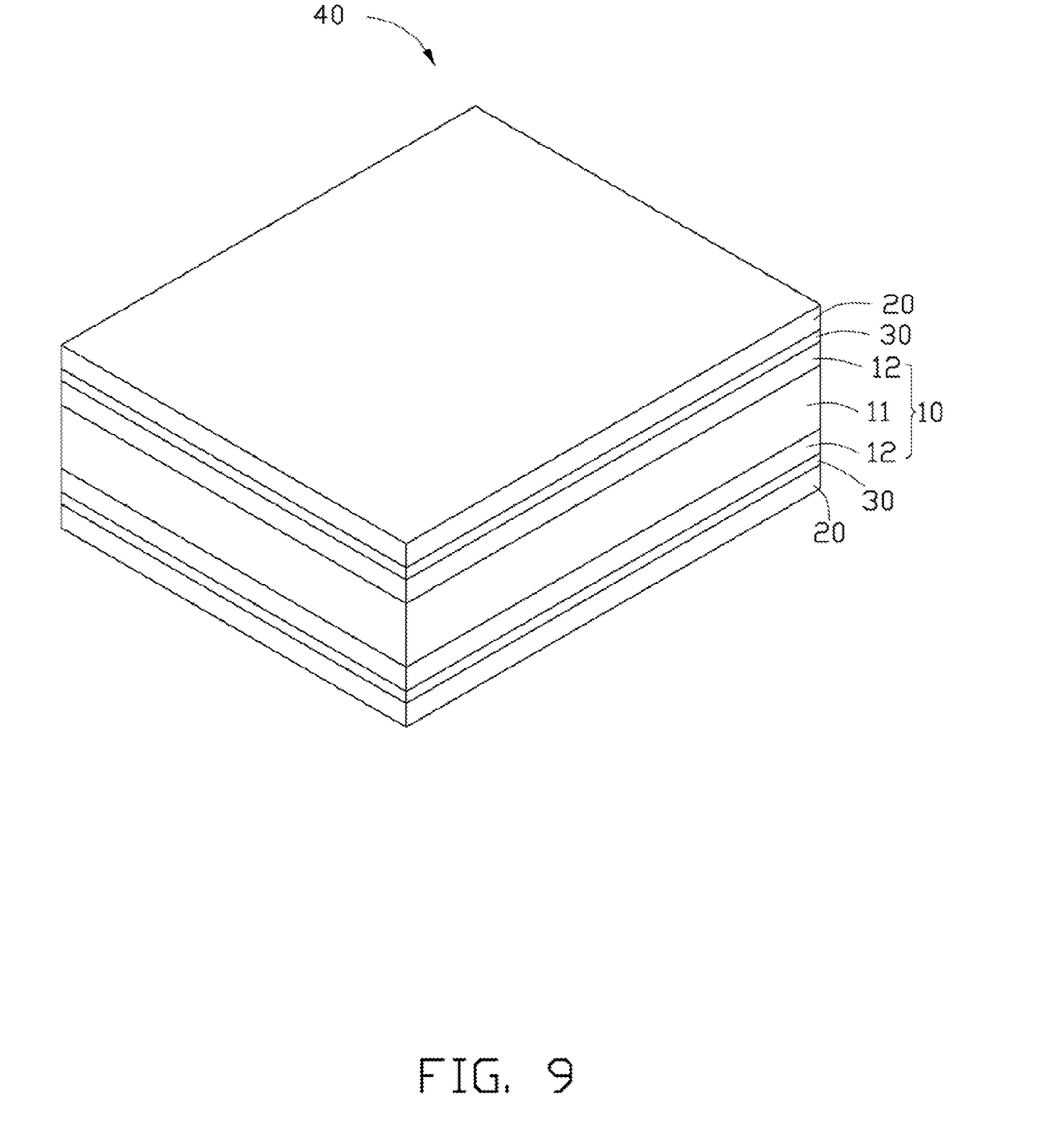
FIG. 9 is similar to FIG. 3, but showing two second copper clad laminates formed on two opposite sides of the first copper clad laminate with an adhesive layer respectively.

In step 3, referring to FIG. 9, at least a second copper clad laminate 20 and at least an adhesive layer 30 are provided. The second copper clad laminate 20 and the adhesive layer 30 are laminated onto the first copper clad laminate 10 in a manner that the adhesive layer is sandwiched between the first and the second copper clad laminates 10 and 20, thus obtaining a multilayer substrate 40 after determining the central axis.

The second copper clad laminate 20 includes a second copper foil layer. The size of the second copper clad laminate 20 matches with that of the first copper clad laminate 10.

The adhesive layer 30 can be chosen from epoxy, polyester, or acrylic. The size of the adhesive layer 30 matches with that of the first copper clad laminate 10. In an alternative embodiment, the adhesive layer 30 can be pre-formed on a surface of the second copper foil layer as an insulating layer of the second copper clad laminate 20.

The multilayer substrate 40 is formed according to the following processes. The second copper clad laminate 20 and the adhesive layer 30 is laminated onto the first copper clad laminate in a manner that the adhesive layer 30 is sandwiched between the first and the second copper clad laminates 10 and 20. Then a laminating device is used to laminate the first copper clad laminate 10, the adhesive layer 30, and the second copper clad laminate 20. As such, the multilayer substrate 40 is obtained after determining the central axis. In the laminating process, for the first copper clad laminate 10, second copper clad laminate 20, and the adhesive layer 30 comprise different materials, and different materials have different shrinkage or expansion rate, the groups of concentric copper annular collar 14 may bias the initial location. That is to say, the central axes of the groups of concentric copper annular collars 14 are may not the determined central axes after laminating the second copper clad laminate 20 and the adhesive layer 30.

Figure 10:
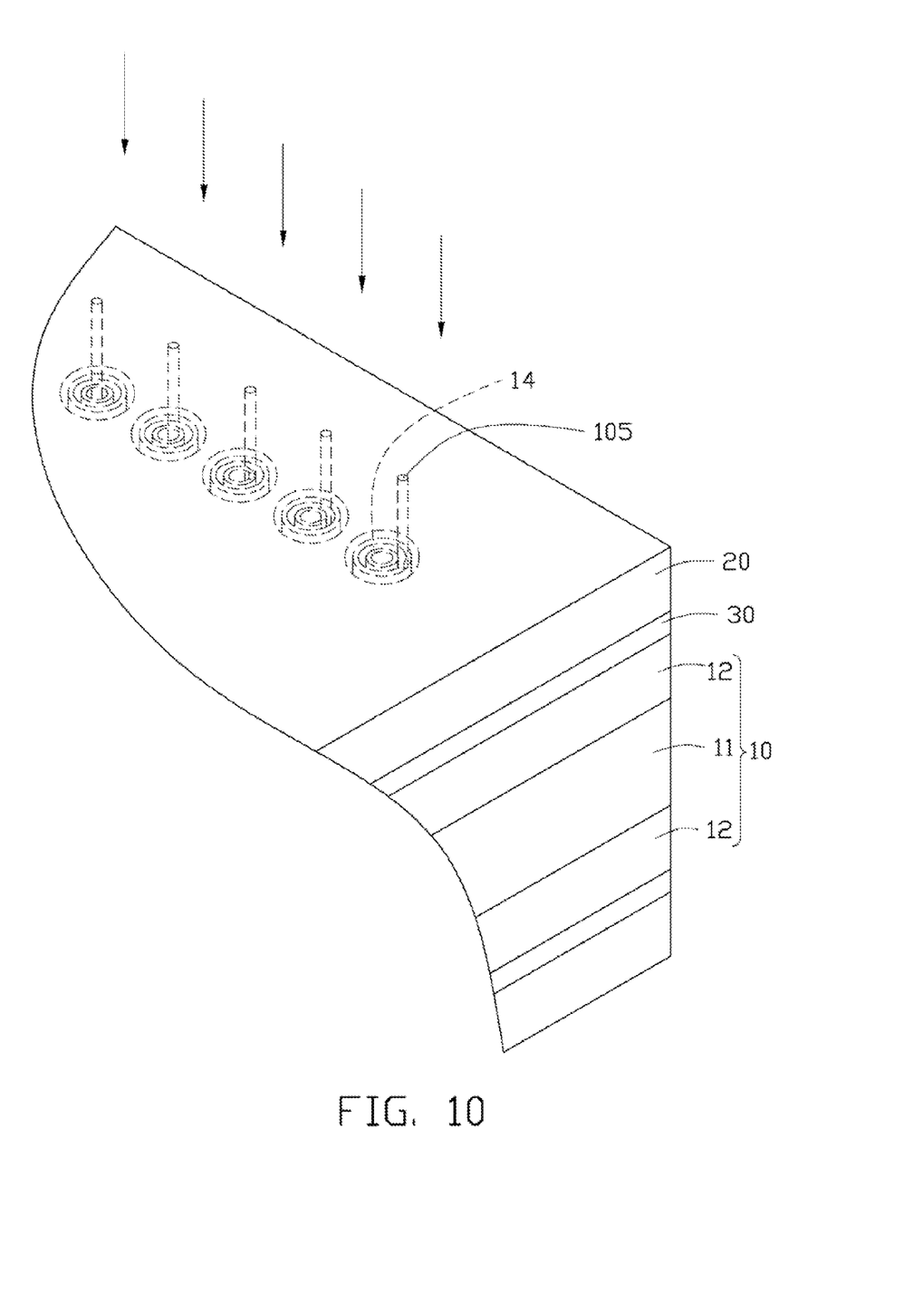
FIG. 10 is similar to FIG. 9, but showing detection holes formed through a multilayer substrate.

In step 4, referring to FIG. 10, a number of detection holes 105 are formed in the multilayer substrate 40. The detection holes 105 run through the first copper clad laminate 10, the adhesive layer 30, and the second copper clad laminate 20, and correspond to the groups of the concentric copper annular collars 14. That is, the number of the detection holes 105 is equal to the number of groups of the concentric copper annular collars 14, and the detection holes 105 are along the central axes determined prior to laminating the second copper clad laminate and the adhesive layer, that is, the central axes of the detection holes 105 are coaxial with the determined central axes, respectively. In the illustrated embodiment as shown in FIG. 10, the number of the detection holes 105 and the number of the concentric copper annular collars 14 are equal to five, the five detection holes 105 are about the five determined central axes. That is, the central axes of the five detection holes 105 are coaxial with the five determined central axes of the first copper annular collars 141, respectively.

The way to form the detection holes 105 can be by mechanical drilling or laser ablation. A diameter of the detection hole 105 is smaller than that of the inner diameter of the first copper annular collar 141. In particular, the diameter of the detection hole 105 equals to the diameter of the smallest one of the plated through holes to be formed in the multilayer printed circuit board.

Figure 11:
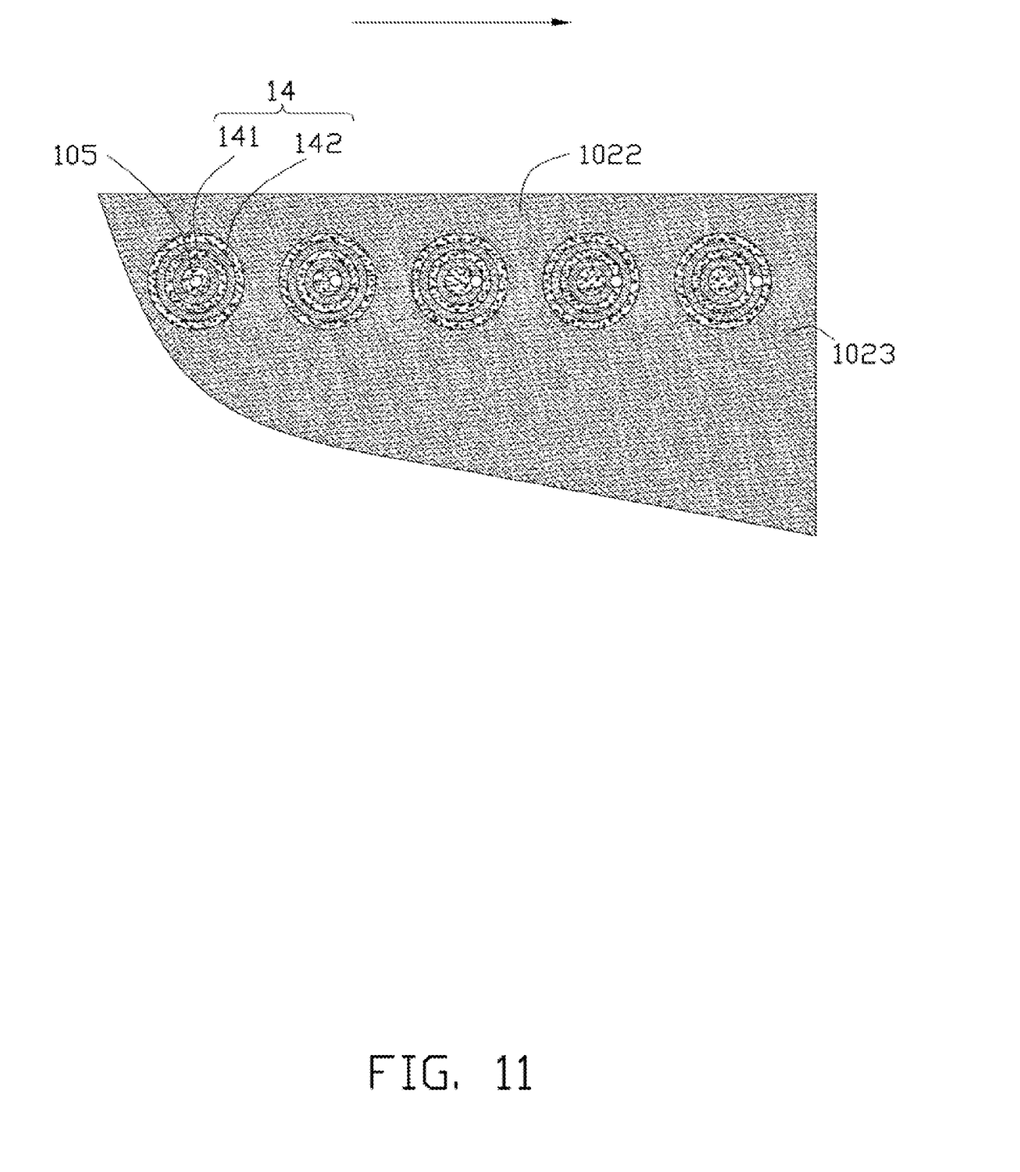
FIG. 11 is a projective drawing of FIG. 10 irradiated by a light source.

In step 5, referring to FIGS. 10 and 11, the location relationship between the detection hole 105 and the group of concentric copper annular collar 14 is obtained to figure out a bias error of the detection hole 105 based on the determined central axis.

Referring to FIG. 10, an X-ray light source emits X-rays to irradiate the multilayer substrate 40. The X-rays can partly pass through the multilayer substrate 40 and obtain a projective drawing, thereby, an X-ray image of the multilayer substrate 40 is captured as shown in FIG. 11. Due to the copper and the insulating layer having different X-ray transmittance, the X-ray image illustrates different brightness. The brightest areas correspond to the detection holes 105, for the X-ray can substantially pass through the detection holes 105. The darkest areas correspond to areas where the copper of the first copper clad laminate 10 still remain, for the X-ray can hardly pass through, such as the area corresponding to the first copper annular collar 141, the area corresponding to the second copper annular collar 142, and the rest peripheral portion 102. The other areas correspond to areas where the copper of the first copper clad laminate 10 has been removed. The X-ray can partly pass through the area surrounded by the first copper annular collar 141, the area between the first copper annular collar 141 and the second copper annular collar 142, and the area between the second copper annular collar 142 and the peripheral portion 102.

Referring to FIG. 11, it shows an X-ray image corresponding to the five groups of concentric copper annular collars 14 in the second edge portion 1022. For example, the diameter of the detection hole 105 equals to the diameter of the smallest one of the plated through holes, and is d mil, the inner diameter of the first copper annular collar 141 is (d+2) mil, the gap distance between the first copper annular collar 141 and the second copper annular collar 142 is 2 mil. The thickness of the sidewall of the first copper annular collar 141 is 2 mil, the thickness of the sidewall of the second copper annular collar 142 is 2 mil. From the X-ray image in FIG. 11, we can know that, along the arrow direction, the first detection hole 105 has no bias error, the second detection hole 105 has a bias error of 2 mil, the third detection hole 105 has a bias error of 4 mil, the fourth detection hole 105 has a bias error of 6 mil, and the fifth detection hole 105 has a bias error of 8 mil. In other words, after laminating, a portion of the multilayer substrate 40 adjacent to the third edge portion 1023 the shrinkage is in the inverse direction of the arrow.

It can be understood that, the shrinkage or expansion of the other portion of the multilayer substrate 40 can be observed from the X-ray image of other detection holes 105 in the first edge portion 1021, the third edge portion 1023 and the fourth edge portion 1024.

In step 6, Referring to FIGS. 10 and 11, the X-ray image is analyzed to determine an offset distance between the detective hole 105 and the determined central axis. Then, a number of plated through holes can be formed in the central portion 101 of the multilayer substrate 40 based on the offset distance.

In an exemplary embodiment, the shrinkage or expansion rate of the second copper clad laminate 20 is determined based on the offset distance, and locations of the plated through holes is determined based on the shrinkage rate or expansion rate. For example, in FIG. 11, the shrinkage or expansion rate K of the second copper clad laminate 20 can be figured out according to the following formula: $K=(\Sigma k_i)/(n-1)=(\Sigma(a_i-b_i)/a_i)/(n-1)$. Wherein, $k_i$ denotes a shrinkage or expansion rate between two adjacent groups of concentric copper annular collars 14, $a_i$ denotes a distance between two initial reference axes of two adjacent groups of concentric copper annular collars 14 before laminating, $b_i$ denotes a distance between two central axes of the two adjacent groups of concentric copper annular collars 14 after laminating, n denotes a number of the concentric copper annular collars 14, i denotes a series of numbers from 1 to (n−1). In this embodiment, provided that the distance $a_i$ equals to D mil, because the value of $(a_i-b_i)$ equals to 2 mil, as such, $K=(\Sigma(a_i-b_i)/a_i)/(n-1)=((n-1)*2/D)/(n-1)=2/D$. That is to say, the shrinkage or expansion rate of the second copper clad laminate 20 equals to 2/D in this embodiment. Therefore, the locations for forming through holes can be modified according to the shrinkage or expansion rate K, the location for forming through holes in the central portion 101 of the multilayer substrate 40 can be obtained.

It can be understood that, the shrinkage or expansion rate of the other portion of the multilayer substrate 40 can be figured out according to the X-ray image of the other detection holes 105 in the first edge portion 1021, the third edge portion 1023, and the fourth edge portion 1024. Therefore, the through holes have high precise position and can be formed according to the modified locations.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A method for manufacturing a multilayer printed circuit board, the method comprising:
   providing a first copper clad laminate comprising a central portion and a peripheral portion;
   etching the peripheral portion of the first copper clad laminate to form a group of concentric copper annular collars, the group of concentric copper annular collars comprising a first copper annular collar and a second copper annular collar surrounding the first copper annular collar;
   determining a central axis of the first copper annular collar;
   laminating a second copper clad laminate and an adhesive layer onto the first copper clad laminate in a manner that the adhesive layer is sandwiched between the first and the second copper clad laminates, thus obtaining a multilayer substrate after determining the central axis;
   forming a detection hole through the multilayer substrate along the determined central axis;
   capturing an X-ray image of the multilayer substrate;
   analyzing the X-ray image to determine detection hole an offset distance between the detection hole and the determined central axis; and
   forming plated through holes in the central portion of the multilayer substrate based on the offset distance.

2. The method of claim 1, further comprising determining the shrinkage rate or expansion rate of the second copper clad laminate based on the offset distance and determining locations of the plated through holes based on the shrinkage rate or expansion rate.

3. The method of claim 1, wherein a diameter of the detection hole is smaller than an inner diameter of the first copper annular collar.

4. The method of claim 3, wherein the inner diameter of the first copper annular collar is equal to a gap distance between the first copper annular collar and the second copper annular collar plus a diameter of the smallest one of the plated through holes.

5. The method of claim 3, wherein a sidewall of each of the first copper annular collar and the second annular collar has a thickness equal to a gap distance between the first copper annular collar and the second copper annular collar.

6. The method of claim 1, wherein the first copper clad laminate includes a first insulating layer and a first copper foil layer attached on the first insulating layer, the group of concentric copper annular collars is formed by only etching the first copper foil layer.

7. The method of claim 1, wherein the first copper clad laminate includes a first insulating layer and two first copper foil layers attached on opposite surfaces of the first insulating layer, the group of concentric copper annular collars is formed by only etching the two first copper foil layers, the group of concentric copper annular collars on one first copper foil layer spatially corresponds to that of the other first copper foil layer.

8. A method for manufacturing a multilayer printed circuit board, the method comprising:
   providing a first copper clad laminate comprising a central portion and a peripheral portion;
   etching the peripheral portion of the first copper clad laminate to form a plurality of groups of concentric copper annular collars surrounding the central portion, each group of the concentric copper annular collars comprising a first copper annular collar and a second copper annular collar surrounding the first copper annular collar;
   determining a central axis of each of the first copper annular collar;
   laminating a second copper clad laminate and an adhesive layer onto the first copper clad laminate in a manner that the adhesive layer is sandwiched between the first and the second copper clad laminates, thus obtaining a multilayer substrate after determining the central axes;
   forming a plurality of detection holes through the multilayer substrate along the respective determined central axes;
   capturing an X-ray image of the multilayer substrate;
   analyzing the X-ray image to determine an offset distance between the detection hole and the corresponding determined central axis; and
   forming plated through holes in the central portion of the multilayer substrate based on the offset distance.

9. The method of claim 8, further comprising determining the shrinkage rate or expansion rate of the second copper clad laminate based on each of the offset distance and determining locations of the plated through holes based on the shrinkage rate or expansion rate.

10. The method of claim 8, wherein a diameter of each of the detection holes is smaller than an inner diameter of the corresponding first copper annular collar.

11. The method of claim 10, wherein the inner diameter of each of the first copper annular collar is equal to a gap distance between the corresponding first copper annular collar and the corresponding second copper annular collar plus a diameter of the smallest one of the plated through holes.

12. The method of claim 10, wherein a sidewall of each of a first copper annular collar and a corresponding second annular collar has a thickness equal to a gap distance between the corresponding first copper annular collar and the corresponding second copper annular collar.

13. The method of claim 8, wherein the first copper clad laminate includes a first insulating layer and a first copper foil layer attached on the insulating layer, the plurality of groups of concentric copper annular collars are formed by only etching the first copper foil layer.

14. The method of claim 8, wherein the first copper clad laminate includes a first insulating layer and two first copper foil layers attached on opposite surfaces of the first insulating layer, the plurality of groups of concentric copper annular collars are formed by only etching the two first copper foil layers, the groups of concentric copper annular collars on one first copper foil layer spatially corresponds to that of the other first copper foil layer respectively.

15. The method of claim 8, wherein the first copper clad laminate is rectangular, the peripheral portion including a first edge portion, a second edge portion, a third edge portion opposing to the first edge portion, and a fourth edge portion opposing to the second edge portion, the first edge portion, the second edge portion, the third edge portion and the fourth edge portion each having at least one group of concentric copper annular collars, the at least one group of concentric copper annular collars on the first edge portion being adjacent to the second edge portion, the at least one group of the concentric copper annular collars on the second edge portion being adjacent to the third edge portion, the at least one group of the concentric copper annular collars on the third edge portion being adjacent to the fourth edge portion, the at least one group of concentric copper annular collars on the fourth edge portion being adjacent to the first edge portion.

16. The method of claim 8, wherein the first copper clad laminate is rectangular, the peripheral portion including a first edge portion, a second edge portion, a third edge portion opposing to the first edge portion, and a fourth edge portion opposing to the second edge portion, the first edge portion, the second edge portion, the third edge portion and the fourth edge portion each having a plurality of groups of concentric copper annular collars, the plurality of groups of concentric copper annular collars on each of the first edge portion, the second edge portion, the third edge portion and the fourth edge portion being equidistantly arranged along a straight line.

17. The method of claim 8, wherein the first copper clad laminate is rectangular, the peripheral portion including a first edge portion, a second edge portion, a third edge portion opposing to the first edge portion, and a fourth edge portion opposing to the second edge portion, the first edge portion and the third edge portion each having a plurality of groups of concentric copper annular collars, the plurality of groups of concentric copper annular collars on the first edge portion consisting of two congregated groups, one group being adjacent to the second edge portion, another group being adjacent to the fourth edge portion, the plurality of groups of concentric copper annular collars on the third edge portion consisting of two congregated groups, one group being adjacent to the second edge portion, another group being adjacent to the fourth edge portion.

18. The method of claim 8, wherein the first copper clad laminate is rectangular and has four corners on the peripheral portion, each corner consisting of three groups of concentric copper annular collars arranged on three top-points of a triangle.

19. The method of claim 8, wherein the first copper foil layer is rectangular and has four corners on the peripheral portion, each corner consisting of two groups of concentric copper annular collars arranged alone a line parallel to a diagonal of a top surface of the first copper clad laminate.

20. The method of claim 8, wherein the first copper clad laminate is rectangular, the peripheral portion including a first edge portion, a second edge portion, a third edge portion opposing to the first edge portion, and a fourth edge portion opposing to the second edge portion, the first edge portion consisting of one group of concentric copper annular collars being adjacent to the second edge portion, the third edge portion consisting of one group of concentric copper annular collars being adjacent to the second edge portion, the fourth edge portion consisting of two groups of concentric copper annular collars being adjacent to the first edge portion and the third edge portion respectively.

* * * * *